United States Patent [19]

Sakata et al.

[11] Patent Number: 5,663,572
[45] Date of Patent: Sep. 2, 1997

[54] OPTICAL FUNCTIONAL SEMICONDUCTOR ELEMENT

[75] Inventors: Haruhisa Sakata, Ohmiya; Katsuyuki Utaka, Tokyo; Yuichi Matsushima, Tokorozawa, all of Japan

[73] Assignee: Kokusai Denshin Denwa Kabushiki Kaisha, Tokyo, Japan

[21] Appl. No.: 406,501

[22] Filed: Mar. 20, 1995

[30] Foreign Application Priority Data

Mar. 25, 1994 [JP] Japan ................... 6-077870

[51] Int. Cl.⁶ ................................................. H01L 29/06
[52] U.S. Cl. ...................... 257/25; 257/85; 257/13
[58] Field of Search .......................... 257/25, 13, 21, 257/23, 85

[56] References Cited

U.S. PATENT DOCUMENTS 5,416,338  5/1995  Suzuki et al. ................... 257/21

FOREIGN PATENT DOCUMENTS 62-205658  9/1987  Japan ........................... 257/23
6-202182   7/1994  Japan .

*Primary Examiner*—Jerome Jackson
*Assistant Examiner*—Courtney A. Bowers
*Attorney, Agent, or Firm*—Emmanuel J. Lobato; Burns & Lobato, P.C.

[57] ABSTRACT

An optical functional semiconductor element which performs ultrafast, high-contrast logic operation through utilization of the high speed of light velocity. A resonant-tunneling diode having a negative resistance characteristic is provided apart from a light absorbing layer formed by one of i-type layers of what is called a triangular barrier diode of an nipin or pinip structure, by which as the quantity of incident light increases, the quantity of transmitted current is switched from increase to decrease, the amount of change is made high-contrast and an ultrafast logic operation can be performed.

4 Claims, 14 Drawing Sheets

OPTICAL FUNCTIONAL SEMICONDUCTOR ELEMENT

BACKGROUND OF THE INVENTION

The present invention relates to an optical functional semiconductor element for controlling an optical signal with light which is indispensable to fast optical signal processing in the fields of optical switching and optical information processing.

It is now expected that wide-band, new services which utilize fiber optic communication capable of super wide band, ultrafast transmission, such as picture communication and video distribution, will become widespread. In this instance, ultrafast signal processing is indispensable at nodes to which wide-band signals are concentrated. Attention is now focused on what is called an optical switching, optical signal processing system as a system which meets the above requirement. The optical switching, optical signal processing system is expected to permit faster switching operation than in the case of processing optical signals with an LSI or similar electronic circuit after converting them to electric signals and directly processes the optical signals, considered to allow further reduction of the processing time through parallel processing, or performs processing which makes the most use of properties of light.

One of important function in optical signal processing is a signal identifying capability that identifies an input signal for switching it to a desired route. Usually, a digital sequence of signals uses bit patterns for signal identification; the signal identifying capability is to perform a bit pattern matching operation. The bit pattern matching means a function which makes a check to see whether digital signal bits assigned to respective time slots of a plurality of input signal cells match or not and finally determines whether or not the plurality of cells are identical. The implementation of such a function requires an optical device which performs an exclusive OR (XOR) or exclusive NOR (XNOR) operation as a logical operation to provide a different output signal, depending on whether the plurality of bits are both zeros or ones.

FIG. 16 shows a conventional XOR optical logic element utilizing an optical feedback scheme. Reference numerals 100 and 100' denote phototransistors (HPTs) each composed of n-InP, p-InGaAsP and n-InP layers, and 101 and 101' LEDs each composed of n-InP, InGaAsP and p-InP layers. The LEDs are each connected to one of the two HPTs of the two pairs which are simultaneously irradiated with input light A and input light B, and two units, each consisting of the HPT connected to the LED and the HPT not connected thereto, are connected in parallel to the power supply. In FIG. 17 there is shown the sectional structure of the unit cell surrounded by the one-dot chain line. Reference numeral 102 denotes a semi-insulating InP layer, 103 an n-InP layer, 104 a p-InGaAsP layer, 105 an n-InP layer, 106 an InGaAsP layer, 107 a p-InP layer, 108 a p-InP layer, 109 an Au-Zu layer, 110 an Au-Sn layer, 111 a polyimide layer, and 112 a Ti/Au layer. The InGaAsP layers 104 and 106 correspond to the base layer of each HPT and the light emitting layer of each LED, respectively. If now the input light A (or B) is provided singly as depicted in FIG. 17, the HPT 100 (or 100') is turned ON, and consequently, the HPT 100' (or 100) connected thereto is turned OFF, allowing only the LED 101 (or 101') to emit light. On the other hand, when the input light A and the input light B are both provided, only those HPTs which are not connected to the LEDs 101 and 101' are turned ON; hence, the LEDs draw no current and do not emit light. When both the input light A and the input light B are not provided, no current flows to anywhere and neither of the LEDs does not emit light. From the above-described operations, it will be seen that the input light A and the input light B into the HPTs and the sum of output light C and output light D from the LEDs bear a relationship just like an exclusive OR (XOR).

FIG. 18 shows a development of the Applicants. The figure illustrates an XOR optical logic element employing a resonant-tunneling diode. There is also shown a band diagram of the optical functional semiconductor element for operation in the 1 μm wavelength range which uses semiconductor materials of the InGaAsP/InGaAlAs series. Reference numeral 201 denotes an n-InP layer, 202 an InGaAsP active layer (the energy gap wavelength λg~1.55 μm) which has a PN junction in its one interface and is capable of emitting light or modulating the transmittance by the injection thereinto of carriers, 203 an n-InP layer, 204 an i-InGaAs light absorbing layer (λg~1.65 μm) which is capable of generating electron and hole carriers by absorbing light of a particular wavelength, 205 an i-InGaAs tunnel barrier layer, 206 a strained InGaAs or strained InAs quantum well layer, 207 an i-InAlAs tunnel barrier layer, 208 a p-InGaAs layer, 209 an i-InAlAs layer and 210 an InP layer. The layers 205, 206 and 207 form what is called a resonant-tunneling diode (RTD) 211, and the layers 204, 208 and 209 form what is called a triangular barrier diode (TBD) 212. The RDT 211 is provided in one of the i-layers of the TBD 212. Incidentally, the broken line indicates the Fermi-level. In this element, only when irradiated with light of an appropriate intensity, the active layer 202 is put in the ON state in which it is high-gain and is capable of emitting light or performing lasing, and when the incident light is absent or has an excessively high intensity, the layer 202 is put in the OFF state in which it is high-loss and hardly emits light. Thus, this element is an optical functional element which permits direct control of an optical signal through irradiation with light. In this instance, the high light sensitivity of the TBD 212 provides a high-efficiency, high-contrast characteristic even if the quantity of incident light is very small. Moreover, a bistable state can be achieved in the input/output characteristic.

The optical functional element which performs XOR and other logical operation through utilization of the conventional optical feedback scheme, as described above, converts the optical signal by a phototransistor to an electric signal and then drives a light emitting diode of low operating speed; hence, this element has the shortcoming of low operating speed. Furthermore, it is disadvantageous in that its construction and manufacturing process are complicated. In the optical XOR logical element using the RTD, since the resonant-tunneling diode is provided in the i-type layer which is exposed to an internal electric field, the negative resistance characteristic inherent in the resonant-tunneling diode is likely to become indistinct, making it difficult to perform a high-contrast optical logical operation; furthermore, a potential barrier impedes carriers generated in the light absorbing layer from flowing when exposed to an electric field, resulting in the retardation of the optical response operation.

SUMMARY OF THE INVENTION

An object of the present invention is to provide an optical functional semiconductor element which performs an ultrafast, high-contrast logical operation through utilization of the high-velocity property of light.

To attain the above object, the optical functional semiconductor element according to the present invention has a construction in which the resonant-tunneling diode with a resistance characteristic is formed apart from the light absorbing layer which is one of the two i-type layers forming what is called a triangular barrier of an nipin or pinip structure, whereby, as the quantity of incident light increases, the amount of transmitted current is drastically switched from increase to decrease, permitting ultrafast logic operation.

BRIEF DESCRIPTION OF THE DRAWINGS

The present invention will be described in detail below with reference to accompanying drawings, in which.

PREFERRED EMBODIMENTS OF THE INVENTION

[Embodiment 1]

Figure 1:
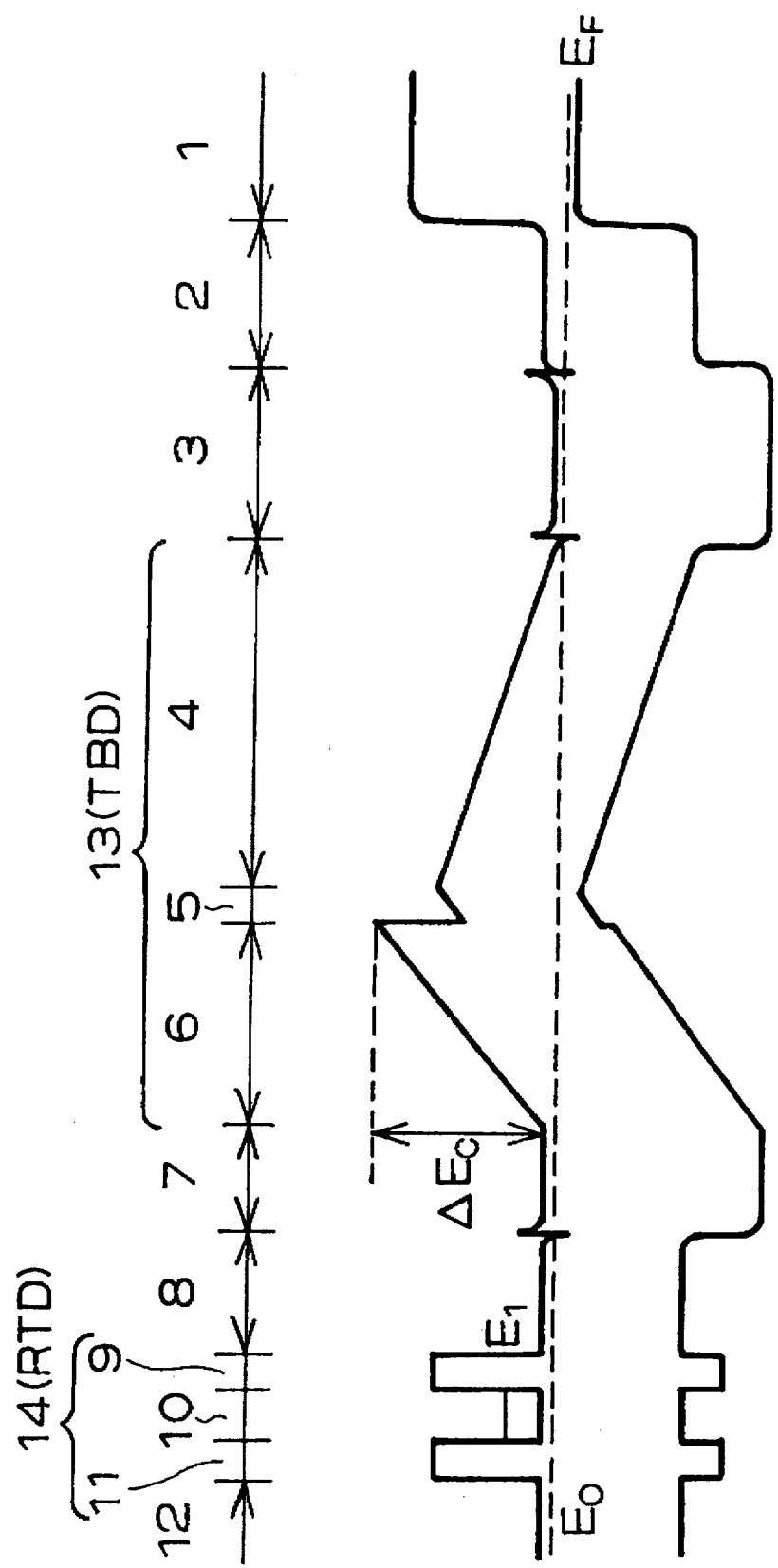
FIG. 1 is a band diagram of the optical functional semiconductor element of the present invention during its thermal equilibrium state.

FIG. 1 shows the band diagram of the optical functional semiconductor element of the present invention when it is in the non-biased condition. The embodiment will be described as being formed of the InGaAsP/InGaAlAs-series semiconductor which operates in the 1 μm wavelength band. Reference numeral denotes a p-InP layer, 2 an InGaAsP active layer (the energy gap wavelength $\lambda g\sim1.55$ μm, and about 0.5 μm in thick) which has a PN junction in its one interface and is capable of emitting light or modulating the transmittance by the injection thereinto of carriers, 3 an n-InP layer (about 1 to 2 μm thick), 4 an i-InGaAs or i-InGaAsP light absorbing layer ($\lambda g\sim1.65$ μm and about 1 to 2 μm thick) which is capable of generating electron and hole carriers by absorbing light of a particular wavelength, 5 a p-InGaAs or p-InGaAsP layer (about 6 nm thick), 6 an i-InGaAlAs or i-InP layer (about 50 to 200 nm thick), 7 an n-InGaAlAs or n-InP layer, 8 an n-InGaAs layer, 9 an i-InAlAs or strained i-AlAs tunneling barrier layer (about 3 nm thick), 10 a strained InGaAs or strained InAs quantum well layer (about 7 nm thick), 11 an i-InAlAs or strained i-AlAs tunneling barrier layer (about 3 nm thick) and 12 an n-InGaAs layer. The layers 9, 10 and 11 form what is called a resonant-tunneling diode (RTD) 14, and the layers 4, 5 and 6 what is called a triangular barrier diode (TBD) 13. The RTD 14 is provided outside the TBD 13. The broken line indicates the Fermi-level.

Figure 2:
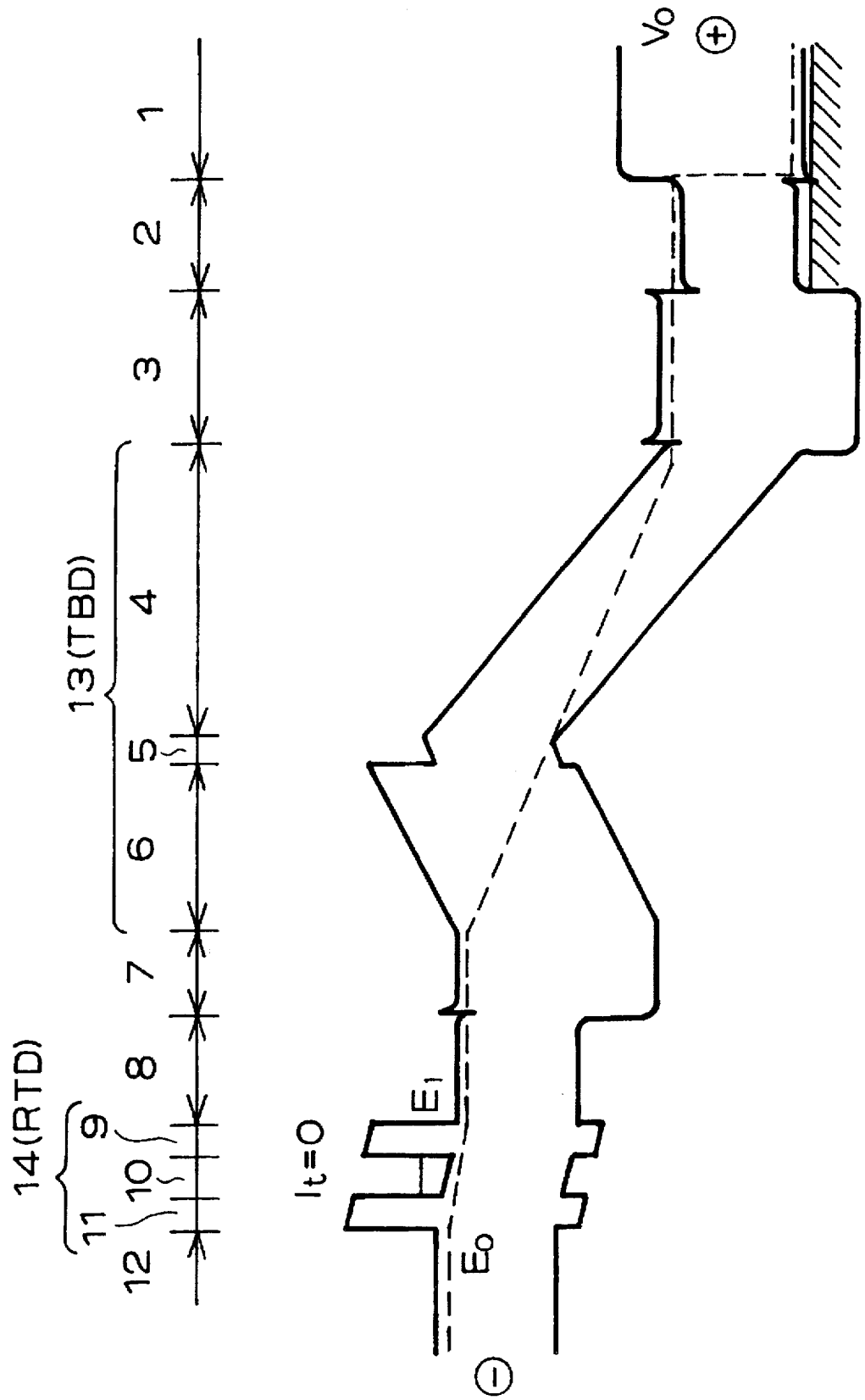
FIG. 2 is a band diagram of the optical functional semiconductor element of the present invention during its non-light-irradiation period.
Figure 3:
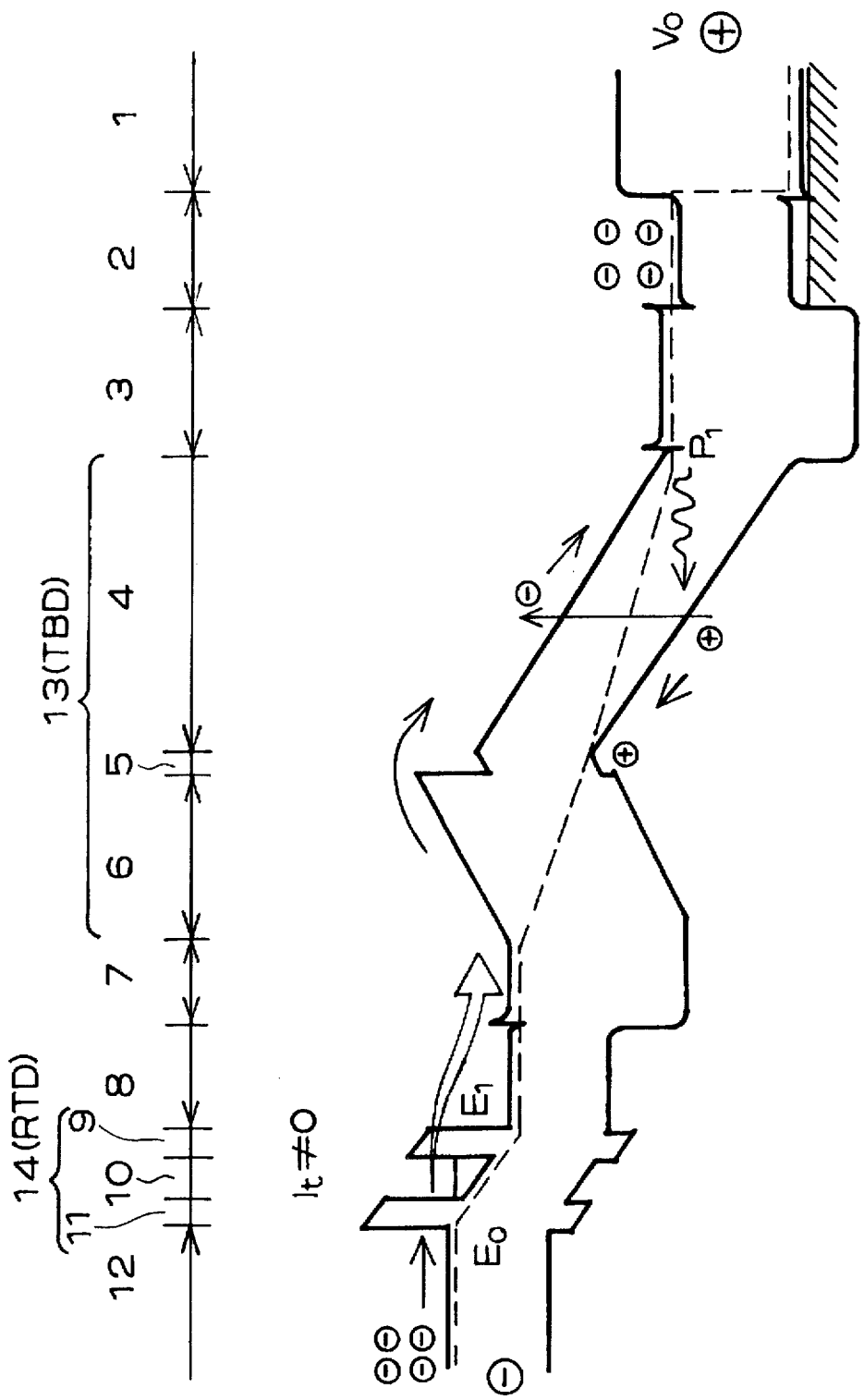
FIG. 3 is a band diagram of the optical functional semiconductor element of the present invention when the energy levels of the emitter layer and the quantum well layer are equal to each other during irradiation with light of an intensity $P_1$.
Figure 4:
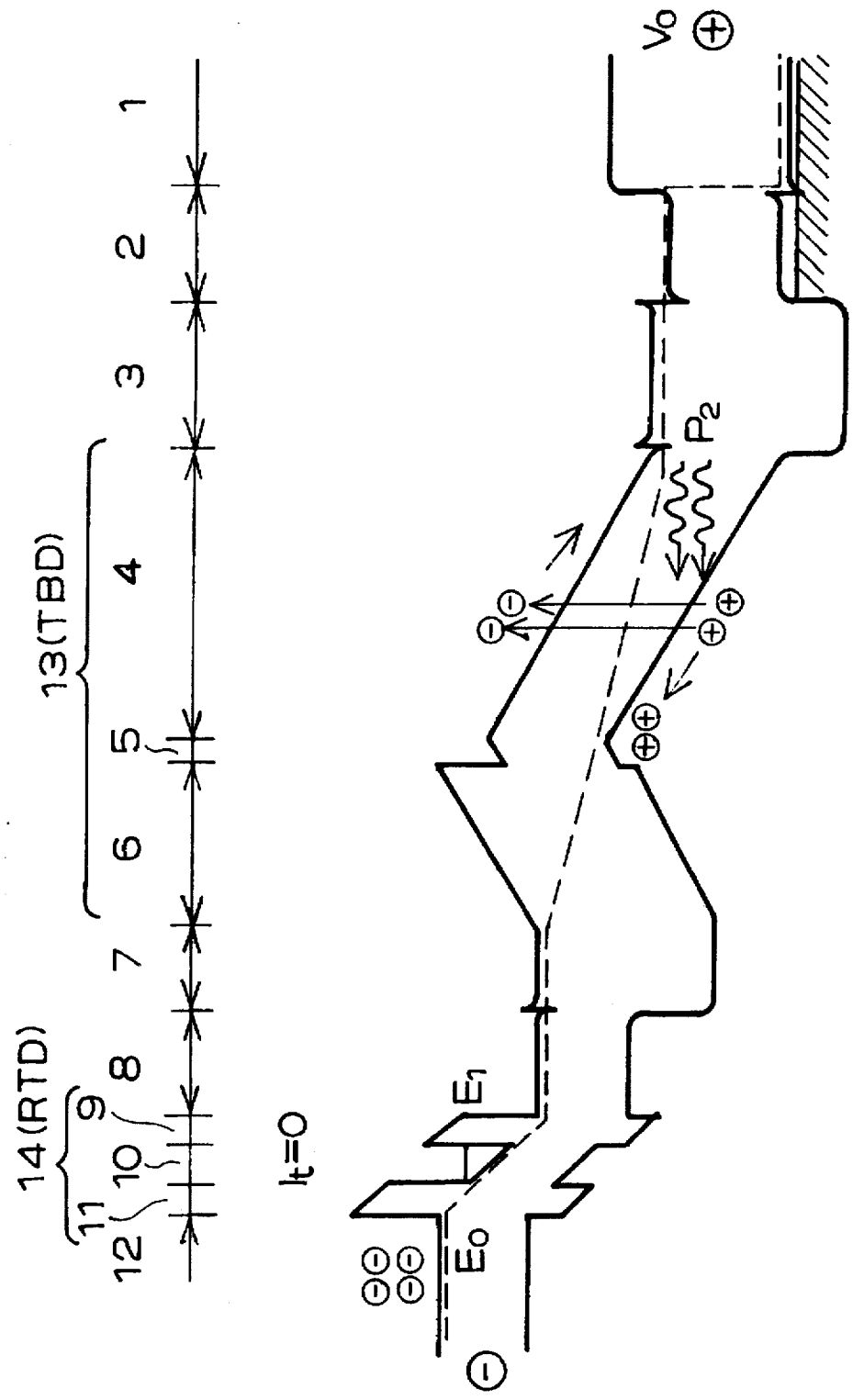
FIG. 4 is a band diagram of the optical functional semiconductor element of the present invention when the energy level of the emitter layer is higher than the energy level of the quantum well layer during irradiation with light of an intensity $P_2$.

A description will be given first of the basic function of each constituent layer of the invention. The RTD 14 comprises barrier layers 9 and 11 of a larger energy gap and the quantum well layer 10 sandwiched therebetween. Since the barrier layers 9 and 11 are as thin as around 3 nm, electrons in the conduction band of the n-InGaAs layer 12 corresponding to an emitter layer of the RTD are allowed to penetrate into the quantum well layer 10 by the tunnel effect, but since the electrons are subjected to multiple reflection in the quantum well layer, the energy level that is permitted to pass therethrough is limited to a discrete quantum energy level $E_1$. Hence, when the voltage across the RTD 14 is low, that is, when a positive voltage that is applied to the n-InGaAs layer 8 serving as the collector layer of the RTD 14 is low, the quantum energy level $E_1$ is larger than the energy $E_0$ on the bottom of the conduction band where the electrons are allowed to stay in the emitter layer 12, as shown in FIG. 2; therefore, substantially no electrons flow from the emitter layer 12. Now, as the voltage across the RTD 14 increases gradually, the difference between the energy levels $E_1$ and $E_0$ decreases, and consequently, electrons begin to flow. When the energy levels $E_0$ and $E_1$ becomes to be nearly equal to each other in terms of voltage as shown in FIG. 3, the energy levels of the emitter layer 12 and the quantum well layer 10 coincide; hence, electrons flow resonantly. As the applied voltage further increases, the energy level $E_0$ becomes to be higher than that $E_1$ and electrons have difficulty in staying in the quantum well layer; hence, the electron current rather decreases as shown in FIG. 4. And, as the applied voltage is further increased, the electron current increases again because electrons flow over the barrier layer. That is, the current-voltage characteristic of the RTD 14 is shaped like a letter N as indicated by the full line in FIG. 5. On the other hand, in the TBD 13, the difference $\Delta E_C$ in the energy of the conduction band bottom between the n-InGaAlAs or n-InP layer 7 and the boundary between the i-InGaAlAs or i-InP layer 6 and the p-InGaAs or p-InGaAsP layer 5 constitutes a barrier against electrons; when a positive bias voltage is applied to the TBD 13 at the side of the collector layer 3 thereof, only those of the electrons which go over the barrier flow as an electron current. In this instance, the control of the barrier $\Delta E_C$ is effected very efficiently by applying a forward bias across the n-InGaAlAs or n-InP layer 7 and the p-InGaAs or p-InGaAsP layer 5. By performing the forward biasing through irradiation with light, the function of a high sensitivity photodetector can be obtained.

The present invention artfully utilizes the function of the RTD having such an N-shaped characteristic, the current control function of the TBD which is highly sensitive to light irradiation and variations in the internal electric field in the i-type layer. Next, a description will be given of the principles of operation of the present invention.

Figure 5:
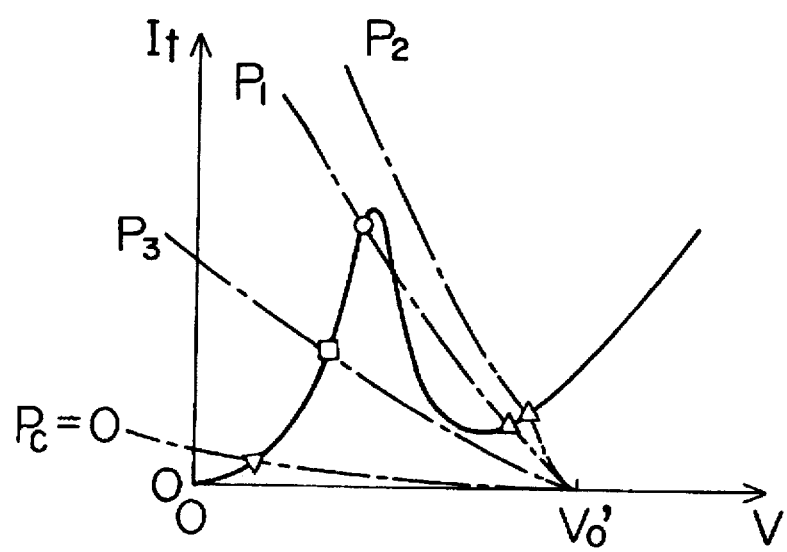
FIG. 5 is a graph showing the voltage-current characteristic of the optical functional semiconductor element according to the present invention.

Normally, a forward bias voltage $V_0$ is applied across the element of the invention to such an extent that the TBD 13 and the RTD 14 are moderately biased as a whole in order to compensate for the energy gap of the PN junction in the interface of the active layer 2 as depicted in FIG. 2 and to provide $E_0<E_1$ when the element is not illuminated. In FIG. 5 there are indicated by the full and one-dot chain lines the current-voltage characteristics of the RTD 14 and TBD 13, $V_0'$ representing the voltage applied across the n-InP layer 3 and the n-InGaAs layer 12. Incidentally, the illustrated characteristics of the TBD 13 correspond to various quantities of incident light. In FIG. 5 there is indicated by $\nabla$ the characteristic in the case of no illumination, that is, in the case of $P_C=0$. In such an instance, since the voltage $V_0'$ is mostly applied to the TBD 13, that is, since substantially no voltage is applied to the RTD 14, the energy $E_0$ is smaller than $E_1$; furthermore, since no additional bias voltage is applied to the p-InGaAs or p-InGaAsP layer 5 yet, the energy difference $\Delta E_C$ is still large. Thus, the current It that flows across the element is substantially zero, and consequently, no current is injected into the active layer 2, which does not emit light and whose light transmittance is also extremely low.

Next, the element is irradiated with light of a wavelength 1.57 μm and an intensity $P_3$, which is absorbed by the light absorbing layer 4. In the light absorbing layer 4 carriers are induced; electrons are transported to the active layer 2 via the n-InP layer 3, whereas holes are transferred to the p-inGaAs or p-InGaAsP layer 5 of a low potential and trapped therein. In consequence, as shown in FIG. 3, the potential of the p-InGaAs or p-InGaAsP layer 5 drops and the barrier $\Delta E_C$ of the TBD 13 becomes lower, permitting electrons to flow over it from the n-GaAlAs or n-InP layer 7 to the right-hand side. This causes a decrease in the number of electrons in the n-InGaAs layer 8 and further biases the RTD 14 accordingly; hence, a difference between the resonance levels $E_1$ and $E_0$ decreases and the current across the RTD 14 increases. Such a balance between the carriers and the bias voltage results in the current It starting to flow (as indicated by the white square in FIG. 5). By setting the intensity of the incident light $P_C$ to a value $P_1$ which reduces the above-mentioned energy difference to substantially zero, the number of electrons which pass through the RTD 14 is maximized. This is indicated by white circles in FIG. 5. These carriers pass through the n-InP layer 3 and flow into the active layer 2, changing its optical gain from minus to plus. That is, assuming that signal light having a wavelength of 1.55 μm, for instance, is input into the active layer 2, the light which is not output therefrom because of a large loss therein is emitted therefrom by the irradiation with the control light $P_C$ which compensates for the loss or even provides gain. Also when no signal light from the outside is present, the carrier injection into the active layer 2 permits the emission therefrom of light and the provision of a resonator in the active layer 2 also permits laser oscillation. Incidentally, since the bias effect on the p-layers of the TBD 13 is extremely highly sensitive to the irradiation with light, the above-said change can be implemented with high efficiency.

When the intensity of the incident light $P_C$ is further increased to $P_2$, the number of carriers induced in the light absorbing layer 4 further increases and the potential of the p-InGaAs or p-InGaAsP layer 5 further drops, resulting in the RTD 14 being biased accordingly. The band diagram in this instance is shown in FIG. 4 and the operating points are indicated by the symbol $\Delta$ in FIG. 5. Thus, the quantum level of the RTD 14 goes below $E_0$, causing a substantial reduction in the number of electrons that flow from the n-InGaAs layer 8 toward the light absorbing layer 4. Consequently, the carrier injection into the active layer 2 is also extremely suppressed and the optical gain becomes minus again. That is, the emission of light or oscillation from the active layer 2 is suppressed and external signal light is not transmitted either. When the intensity of the incident light is reduced from $P_2$ to $P_1$, the operating state follows the preceding hysteresis, and hence is such a state as indicated by the symbol $\Delta$ at one of the intersections of the N-shaped characteristic curve of the RTD 14 and the characteristic curve of the TBD 13 in the case of the light intensity $P_1$ in FIG. 5. Thus, the current $I_t$ flowing in the element remains low-level. When the light intensity is $P_3$, the both characteristic curves intersect at one point; hence, the current $I_t$ takes the level indicated by the white square.

Figure 6:
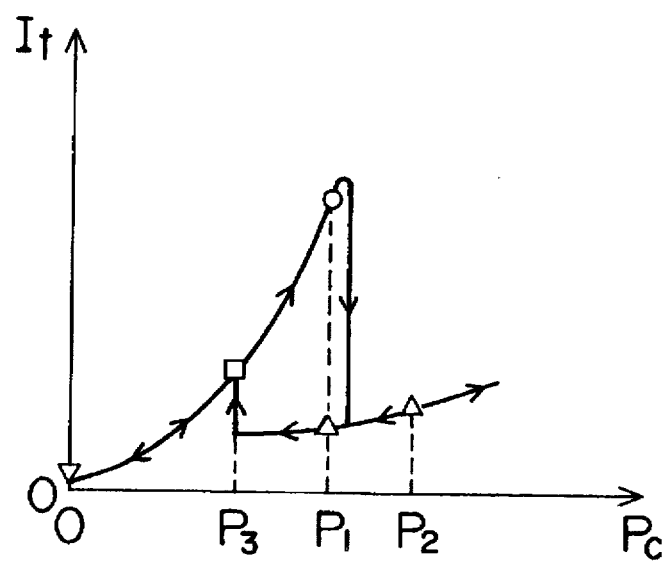
FIG. 6 is a graph showing the optical input-current output characteristic of the optical functional semiconductor element according to the present invention.

Based on the operations described above, the relationship of the current $I_t$ in the element to the intensity of the incident light is such as shown in FIG. 6. That is, the present invention implements an optical functional element which enables the optical signal to be directly controlled by irradiation with light so that only when the intensity of the incident light is moderate, the active layer 2 is put in the ON state in which the optical gain is large and emission of light or even lasing is allowed and when no incident light is present or the intensity is excessively high, the active layer 2 is put in the OFF state in which the optical loss is large and light is hardly emitted. In this case, the high light sensitivity of the TBD 13 provides a high efficiency, high-contrast characteristic even if the quantity of incident light is very small. Besides, a bistable state can be implemented in the input/output characteristics.

[Embodiment 2]

Figure 7:
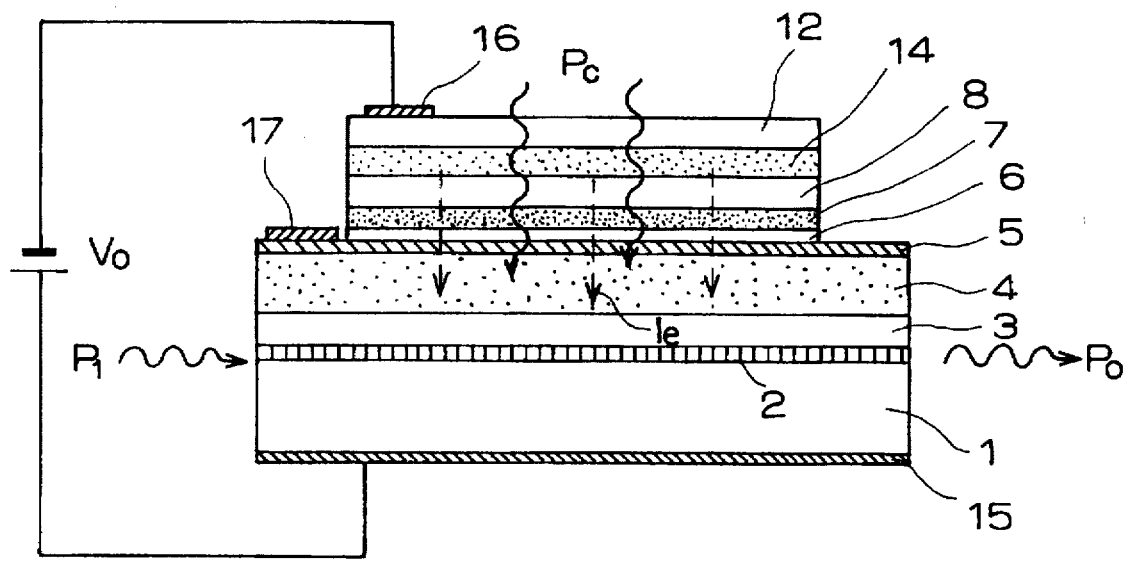
FIG. 7 is a longitudinal-sectional view illustrating a second embodiment of the present invention.

FIG. 7 illustrates a second embodiment of the present invention applied to the actual element structure. This embodiment is directed to an optical functional semiconductor element which is used as an optical logic element. The embodiment will be described to be formed of the InGaAsP/InGaAlAs-series semiconductors for operation in the 1 μm wavelength range. Reference numeral 1 denotes a p-InP layer, 2 an InGaAsP active layer (the energy gap $\lambda g \sim 1.55$ μm, and about 0.5 μm thick) which has a PN junction in its one interface and is capable of emitting light or modulating the light transmittance by the carrier injection thereinto, 3 an n-InP layer (about 1 to 2 μm thick), 4 an i-InGaAs or i-InGaAsP light absorbing layer ($\lambda g \sim 1.65$ μm, and about 1 to 2 μm thick) which is capable of generating electron and hole carriers by absorbing incident light of a particular wavelength, 14 an RTD which is composed of an i-InAlAs or strained i-AlAs tunnel barrier layer (about 3 nm thick), a strained InGaAs or strained InAs quantum well layer (about 7 nm) and an i-InAlAs or strained i-AlAs tunnel barrier layer (about 3 nm thick) as depicted in FIG. 1, 5 a p-InGaAs or p-InGaAsP layer (about 6 nm thick), 6 an i-InGaAlAs or i-InP layer (about 50 to 200 nm thick), and 15, 16 and 17 electrodes. The electrode 16 partly covers the top of the n-InGaAs layer 12. Accordingly, the light absorbing layer 4 is irradiated with the control light $P_C$ from above that top surface area of the layer 12 which is not covered with the electrode 16. The voltage $V_O$ is applied across the electrodes 15 and 16. In this embodiment, only when the intensity of the incident control light $P_C$ is moderate, the active layer 2 is put in the ON state in which it has a high optical gain and is allowed to perform emission Of light or even lasing, and when the control light $P_C$ is not present or has an excessively high intensity, the active layer is put in the OFF state in which it has a high optical gain and is not allowed to emit light.

The operation of this embodiment will be described. The control light $P_C$ is incident to the element from above and its intensity is increased. The control light $P_C$ is absorbed by the light absorbing layer 4 and the number $I_e$ of electrons which pass through the RTD 14 is modulated in accordance with the carriers that are generated in the light absorbing layer 4, and the electrons having passed through the RTD 14 are injected into the active layer 2. By this, the loss of the active layer 2 decreases and the transmittance of the incident signal light $P_i$ increases, thus causing an increase in the quantity of output light $P_O$ that is emitted from the other end face of the active layer 2. On the other hand, when the intensity of the light $P_C$ exceeds $P_1$, the electron transmittance of the RTD rather diminishes as referred to previously and the quantity of output light $P_O$ also decreases. The optical input/output characteristic in this case is shown in FIG. 8.

Figure 8:
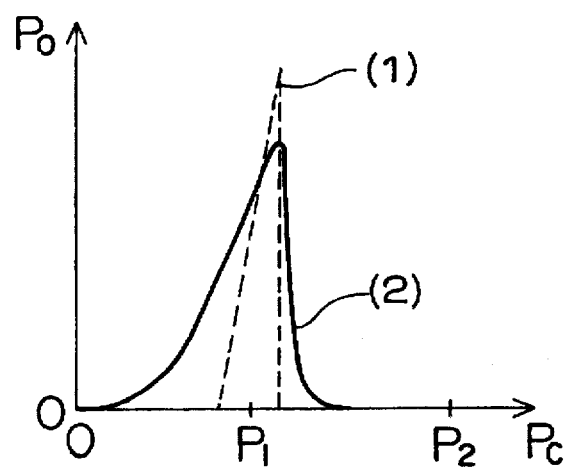
FIG. 8 is a graph showing the optical input-output characteristic of the second embodiment.

By providing a Fabry-Pérot resonator on the end face of the active layer 2 and by setting its lasing threshold value to an appropriate value, the laser resonator including the active layer 2 can be made to oscillate only when $P_C \equiv P_1$, as indicated by the broken line in FIG. 8. Thus, even if the input light $P_i$ into the waveguide is not present, the laser light modulated by the control light $P_C$ can be obtained. If no laser resonator is provided on the active layer 2, a similarly modulated output light $P_O$ is produced in the LED state. The optical input/output characteristic in this instance is such as indicated by the solid line.

While the above embodiments have been described to use a single input of control light $P_C$, what is important is the overall intensity of control light and the number of inputs does not matter. Next, a description will be given of an optical functional element with two inputs. Assume that two inputs $P_{C1}$ and $P_{C2}$ are coupled by a half mirror, coupler or the like into a signal input $P_C$. Table 1 is a truth table showing the relationship between the two optical inputs, in which $P_{C1}=P_{C2}=P_1$ and $P_{C1}+P_{C2}=P_2$ and each light intensity is normalized by the input light intensity $P_1$ which maximizes the output light $P_O$ shown in FIG. 8. That is, the optical functional element of this embodiment produces the output light $P_O$ based on the exclusive OR (XOR) of the two optical inputs $P_{C1}$ and $P_{C2}$.

TABLE 1

| $P_C$ | $P_{C1}/P_1$ | $P_{C2}/P_1$ | $P_O$ |
|---|---|---|---|
| 0 | 0 | 0 | 0 |
| $P_1$ | 1 | 1 | 1 |

TABLE 1-continued

| $P_C$ | $P_{C1}/P_1$ | $P_{C2}/P_1$ | $P_O$ |
|---|---|---|---|
| $P_1$ | 0 | 1 | 1 |
| $P_2$ | 1 | 1 | 0 |

Figure 9:
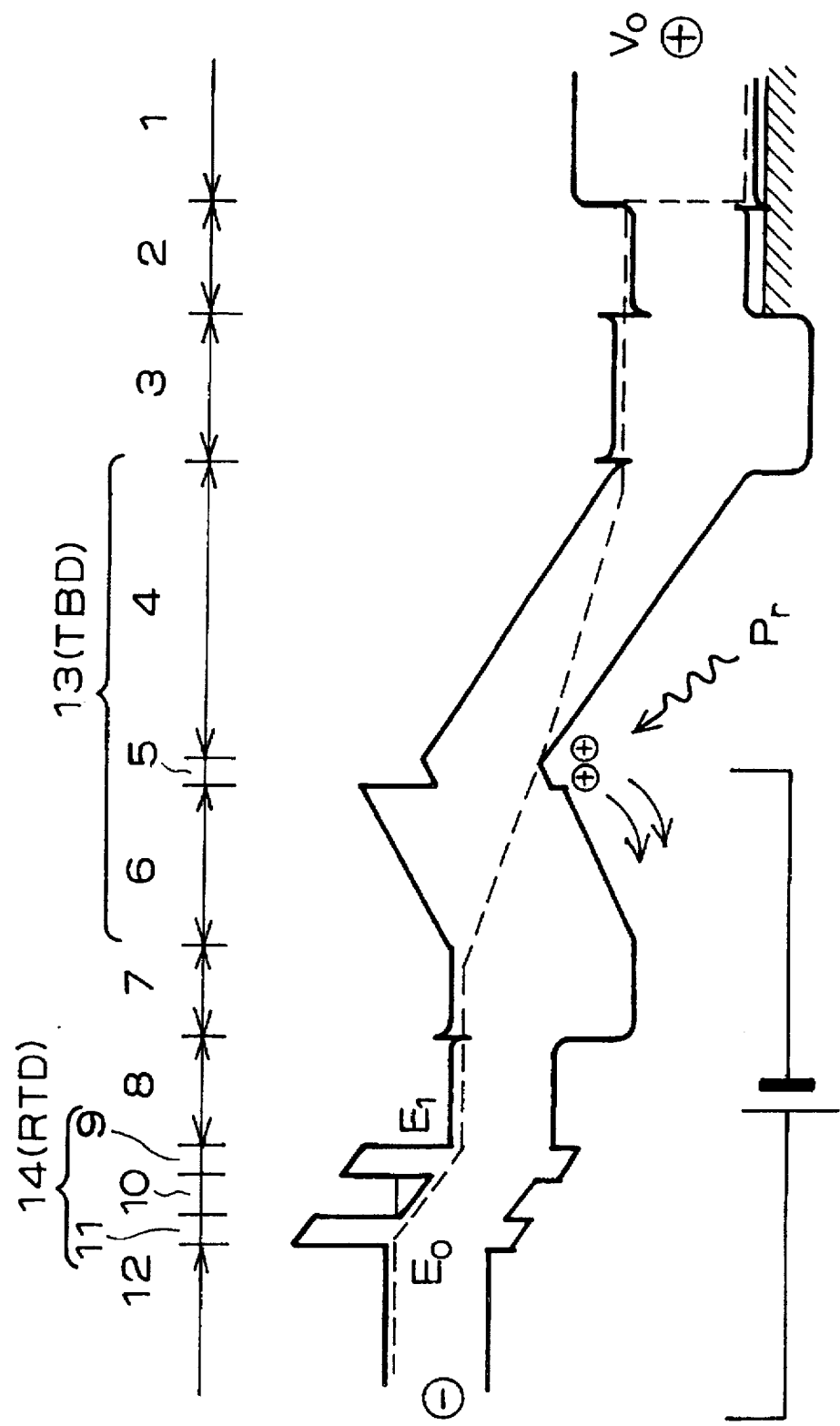
FIG. 9 is a band diagram of the second embodiment when supplied with a carrier rejecting voltage or irradiated with incident light.

With respect to the response characteristic of this element, the holes accumulated in the light absorbing layer 4 naturally disappear within as short a time as several nanoseconds upon completion of the irradiation with the incident light. To further speed up the operation, the holes need only to be forcibly rejected by applying a carrier rejecting bias voltage $V_r$ to the p-InGaAs or p-InGaAsP layer 5 with proper timing or irradiation with light $P_r$ of a wavelength above 1.65 μm as shown in FIG. 9. In the case of using the voltage $V_r$ in the embodiment of FIG. 7, it is applied across the electrodes 16 and 17.

[Embodiment 3]

Figure 10:
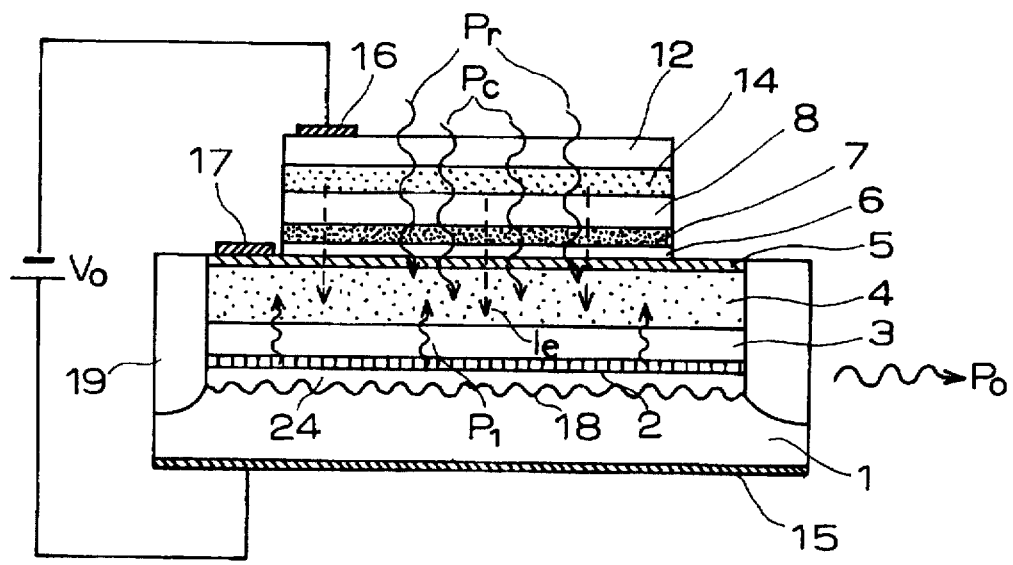
FIG. 10 is a longitudinal-sectional view illustrating a third embodiment of the optical functional semiconductor element according to the present invention.

FIG. 10 illustrates a third embodiment of the present invention, which is an optical functional semiconductor element used as an optical bistable element. This embodiment will be described to be formed of the InGaAsP/InGaAlAs-series semiconductor for operation in the 1 μm wavelength range. Reference numeral 1 denotes a p-InP layer, 2 an InGaAsP active layer (energy gap wavelength λg~1.55 μm and about 0.5 μm thick) which has a PN junction in its one interface and is capable of emitting light or modulating the light transmittance by the carrier injection thereinto, 3 an n-InP layer (about 1 to 2 μm thick, 4 an i-InGaAs or i-InGaAsP light absorbing layer (λg~1.65 μm and about 1 to 2 μm thick) which is capable of generating electron and hole carriers by absorbing incident light of a particular wavelength, 5 a p-InGaAs or p-InGaAsP layer (about 6 nm thick), 6 an i-InGaGlAs or i-InP layer (about 50 to 200 nm thick), 7 an n-InGaAlAs or n-InP layer (about 100 to 300 nm thick), 8 an n-InGaAs layer (about 100 to 300 nm thick), 14 an RTD composed of an i-InGlAs or strained i-AlAs tunnel barrier layer (bout 3 nm thick), a strained InGaAs Or strained InAs quantum well layer (about 7 nm thick) and an i-InAlAs or strained i-AlAs tunnel barrier layer (about 3 nm thick) as shown in FIG. 1, 18 a λ/4 shift diffraction grating which is provided along the active layer 2 to form a DFB laser structure, 19 an InP buried layer serving also as a window structure, 24 a p-InGaAsP buffer layer, and 15, 16 and 17 electrodes. The electrode 16 partly covers the top surface of the n-InGaAs layer 12. Accordingly, the light absorbing layer 4 is irradiated with the control light $P_C$ incident to that top surface area of the layer 12 which is not covered with the electrode 16. The voltage $V_O$ is applied across the electrodes 15 and 16. The active layer 2 and the light absorbing layer 4 have substantially the same composition; for example, they are common in having an energy band wavelength of 1.55 μm. Furthermore, the both layers are disposed relatively close to each other, for instance, approximately 1 to 2 μm apart, so that the light emitted from the active layer 2 is effectively absorbed by the light absorbing layer 4.

The basic structural differences of the optical bistable element of Embodiment 3 from the optical functional element of Embodiment 3 reside in that the resonator is provided in the active layer 2 to form a laser and that the active layer 2 and the light absorbing layer 4 have about the same composition and are disposed relatively close to each other. In Embodiment 3 the λ/4 shift diffraction grating 18 performs the function of a resonator for the active layer 2. The resonator may also be formed by providing mirrors or diffraction gratings on both sides of the active layer 2.

With Embodiment 3, it is possible to implement an optically positive feedback state in which the light emitted from the active layer 2 is absorbed by the light absorbing layer 4; hence, high-contrast, sharp optically-bistable non-linear operations can be achieved.

Figure 11:
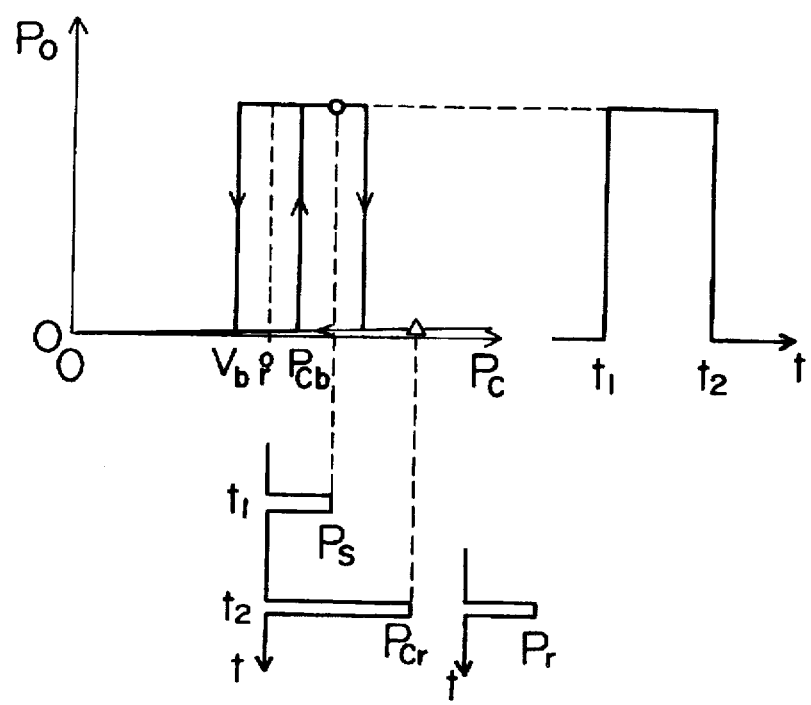
FIG. 11 is a graph showing the optical input-output characteristic of the third embodiment.

The operation of this embodiment will hereinbelow be described. As the control light intensity $P_C$ increases, the electron transmittance of the RTD 14 increases on the principles of operation of the present invention and electrons are injected into the active layer 2. By this, the optical gain is produced in the active layer 2 and the quantity of light which is emitted from the layer 2 increases. Since the active layer 2 and the light absorbing layer 4 have substantially the same composition and are formed relatively close to each other, positive feedback is provided such that a portion $P_1$ of the light emitted from the active layer 2 is absorbed but the remaining portion of the light biases the p-InGaAs or p-InGaAsP layer 5 to permit the passage therethrough of more electrons for injection into the active layer 2 for the emission therefrom of light. With this embodiment which has a construction that provides such optically positive feedback and includes the DFB type resonator formed by the diffraction grating on the active layer 2, it is possible to put the active layer 2 to the state of oscillation at a single stroke at a particular input light intensity, by setting the loss of the resonator to a value such that the oscillation threshold value $I_{th}$ is smaller than the maximum transmitted current. Once the active layer 2 has entered the state of oscillation, even if the quantity of the input light $P_C$ is reduced by the positive feedback, the oscillation is maintained and a fixed output light $P_O$ is provided. Moreover, at a fixed low input level the oscillation abruptly stops. That is, the output light $P_O$ shows a hysteresis characteristic with respect to the input light $P_C$. This is depicted in FIG. 11. By biasing the active layer 2 with a voltage $V_b$ or light $P_{Cb}$ in the hysteresis loop and inputting thereinto an optical pulse of an intensity $P_s$, the layer 2 is switched to the oscillation state indicated by the circle, producing the output light $P_O$.

When the input light intensity exceeds a certain value, the electron transmittance of the RTD 14 diminishes and the injection current $I_s$ into the active layer 2 goes down below the threshold value, stopping the oscillation and reducing the output light down to substantially zero as indicated by the triangle. That is, the output light can be reset by an input light pulse $P_r$ ($>P_s$).

Thus, it is possible to implement an optical memory whose output light is set and reset by the optical pulse, through positive utilization of the positive feedback of light.

[Embodiment 4]

Figure 12:
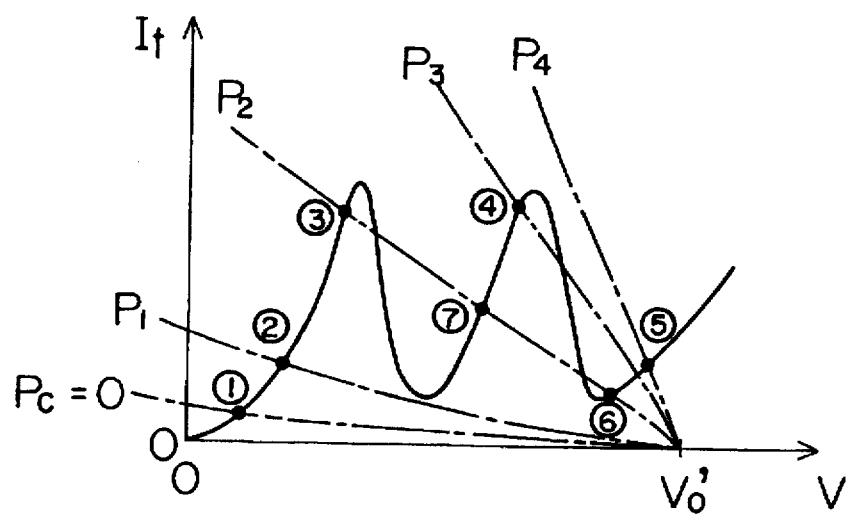
FIG. 12 is a graph showing the current-voltage characteristic of a multi-stable element to which the optical functional semiconductor element of the present invention was applied.
Figure 13:
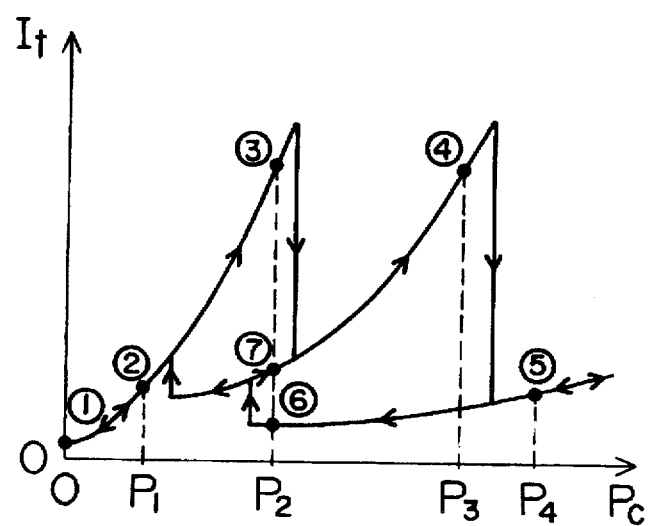
FIG. 13 is a graph showing the current-incident light intensity characteristic of the multi-stable element to which the optical functional element of the present invention was applied.

While the above embodiments have been described to use only one quantum level for the RTD, a plurality of quantum levels may be used. In such an instance, high-performance operations such as a multi-stable operation can be implemented. For example, when the quantum well layer of the RTD is formed about 15 nm thick, the number of quantum levels is two. The current-voltage characteristic of the RTD in this case is indicated by the solid line in FIG. 12; the characteristic has two peaks. In FIG. 12 there are indicated by the One-dot chain lines, the characteristic curves of the TBD in the case where a voltage $V_0'$ is applied to the element and the element is irradiated with rays of light of various intensities. The intersections of the characteristic curves of the RTD and the TBD at the respective light intensities indicate the operating state of the element; in FIG. 13 there is shown the relationship of the current $I_s$ in the element to the incident light intensity $P_C$. The operating point for each light intensity is indicated by the same reference numeral as used for the light intensity in FIG. 12 and a change of the operating point by an increase or decrease in the light intensity is indicated by the arrow. From FIG. 13 it is seen that the bistable state appears for each quantum level on the same principles as referred to previously in respect of FIG. 6. Furthermore, by adjusting the quantum level of the RTD and the applied bias, a tri-stable state can also be achieved within a certain range of light intensity. Thus, when the number of quantum levels used is increased in a similar fashion, the number of stable states can also be increased correspondingly.

[Embodiment 5]

Figure 14:
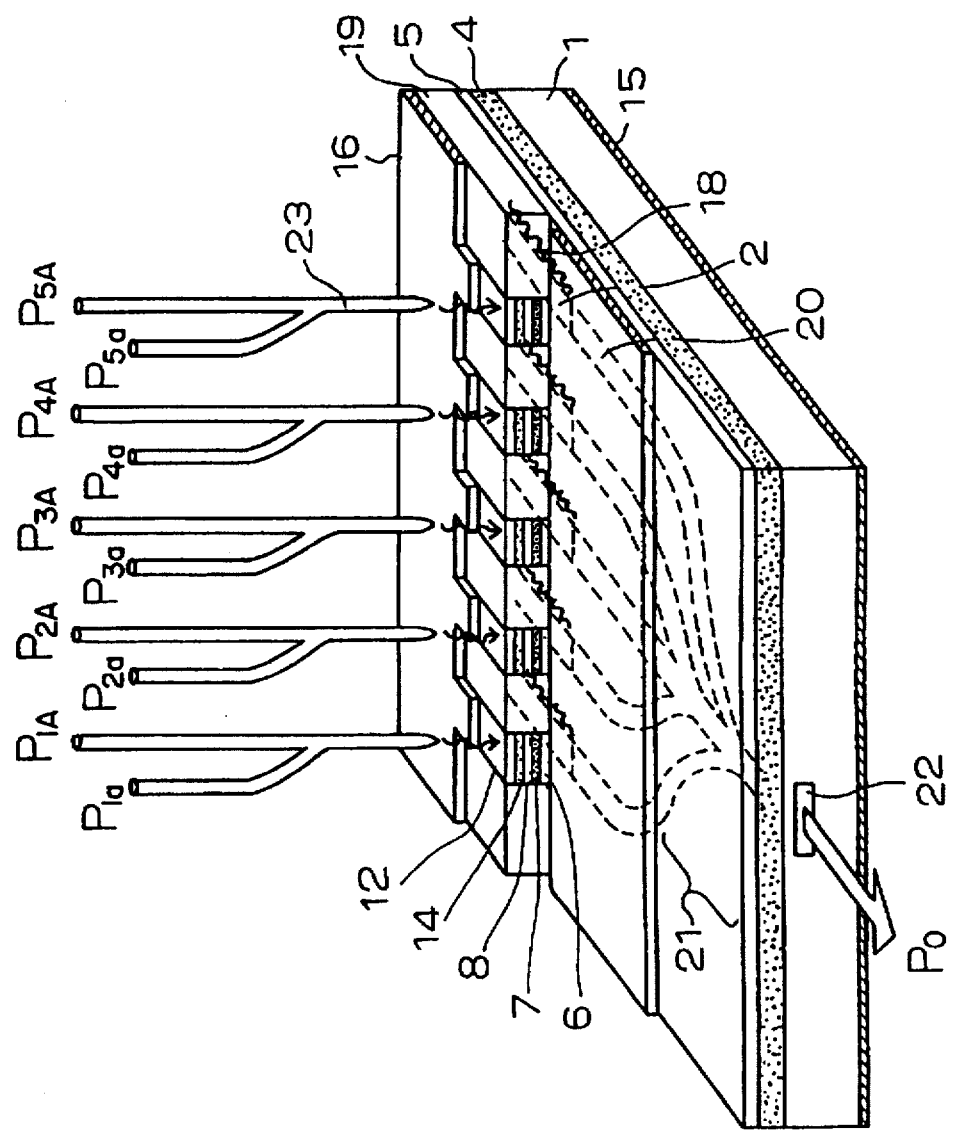
FIG. 14 is a diagram illustrating an embodiment of the optical functional semiconductor element of the present invention applied to a bit pattern matching element.

FIG. 14 illustrates an embodiment of a bit pattern matching element using a plurality of optical functional elements according to the present invention. This embodiment will be described to be formed of the InGaAsP/InGaAlAs-series semiconductor for operation in the 1 μm wavelength range. Reference numeral 1 denotes a p-InP layer, 2 an InGaAsP active layer (the energy gap wavelength λg~1.55 μm and about 0.5 μm thick) which has a PN junction in its one interface and is capable of emitting light or modulating the light transmittance by the carrier injection thereinto, 4 an i-InGaAs or i-InGaAsP light absorbing layer (λg~1.65 μm and about 1 to 2 μm thick) which is capable of generating electron and hole carriers by absorbing incident light of a particular wavelength, 5 a p-InGaAs or p-InGaAsP layer (about 6 nm thick), 6 an i-InGaAlAs or i-InP layer (about 50 to 200 nm thick), 7 an n-InGaAlAs or n-InP layer (about 100 to 300 nm thick), 8 an n-InGaAs layer (about 100 to 300 nm thick), 14 an RTD composed of an i-InAlAs or strained i-AlAs tunnel barrier layer (about 3 nm thick), a strained InGaAs or strained InAs quantum well layer (about 7 nm thick) and an i-InAlAs or strained i-AlAs tunnel barrier layer (about 3 nm thick) as shown in FIG. 1, 18 a λ/4 shift diffraction grating which is provided along the active layer to form a DFB laser structure, 19 an InP buried layer, 20 an InGaAsP output waveguide, 21 an optical multiplexer, 22 an output end face, 23 a fiber for light irradiation use, and 15, 16 and 17 electrodes. This embodiment will be described to have a construction in which five elements are integrated on a single substrate and bit patterns of two five-bit optical pulse trains are correlated with each other.

Figure 15:
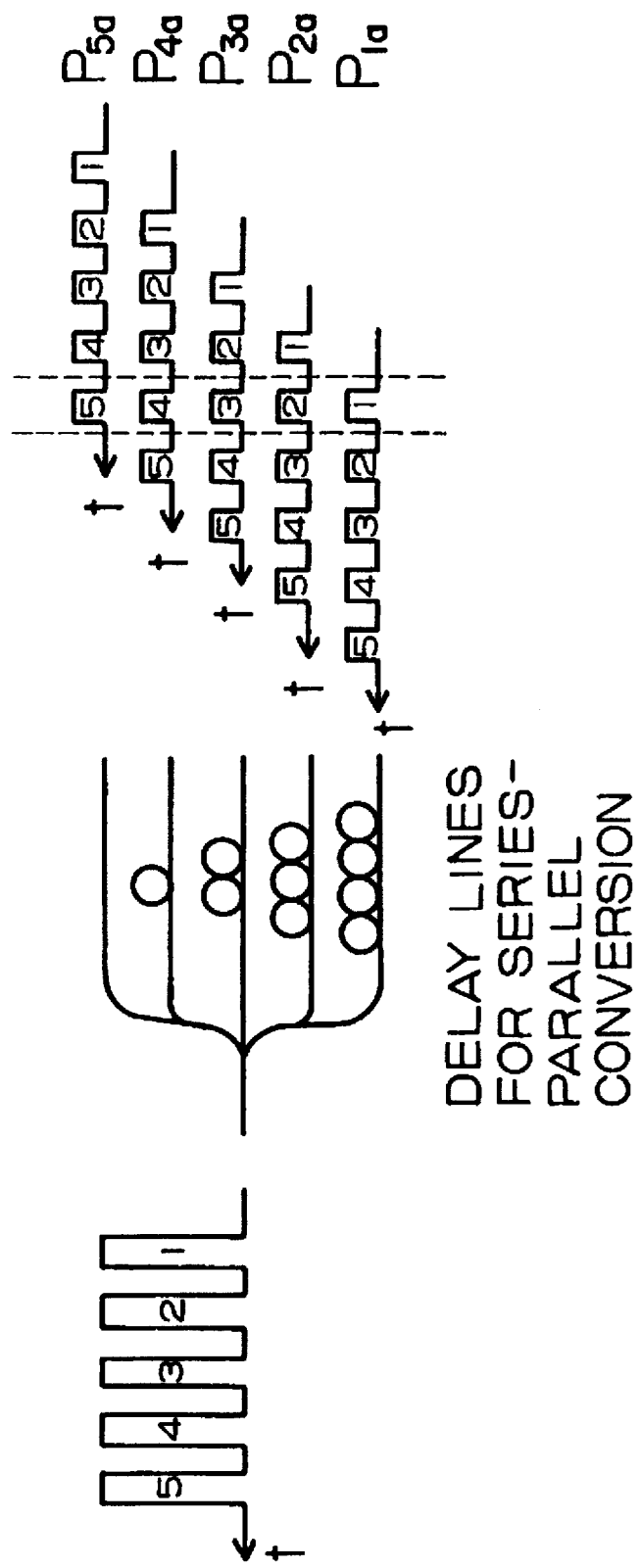
FIG. 15 is a diagram showing an example of a serial-parallel converter for use in the embodiment of FIG. 14.
Figure 16:
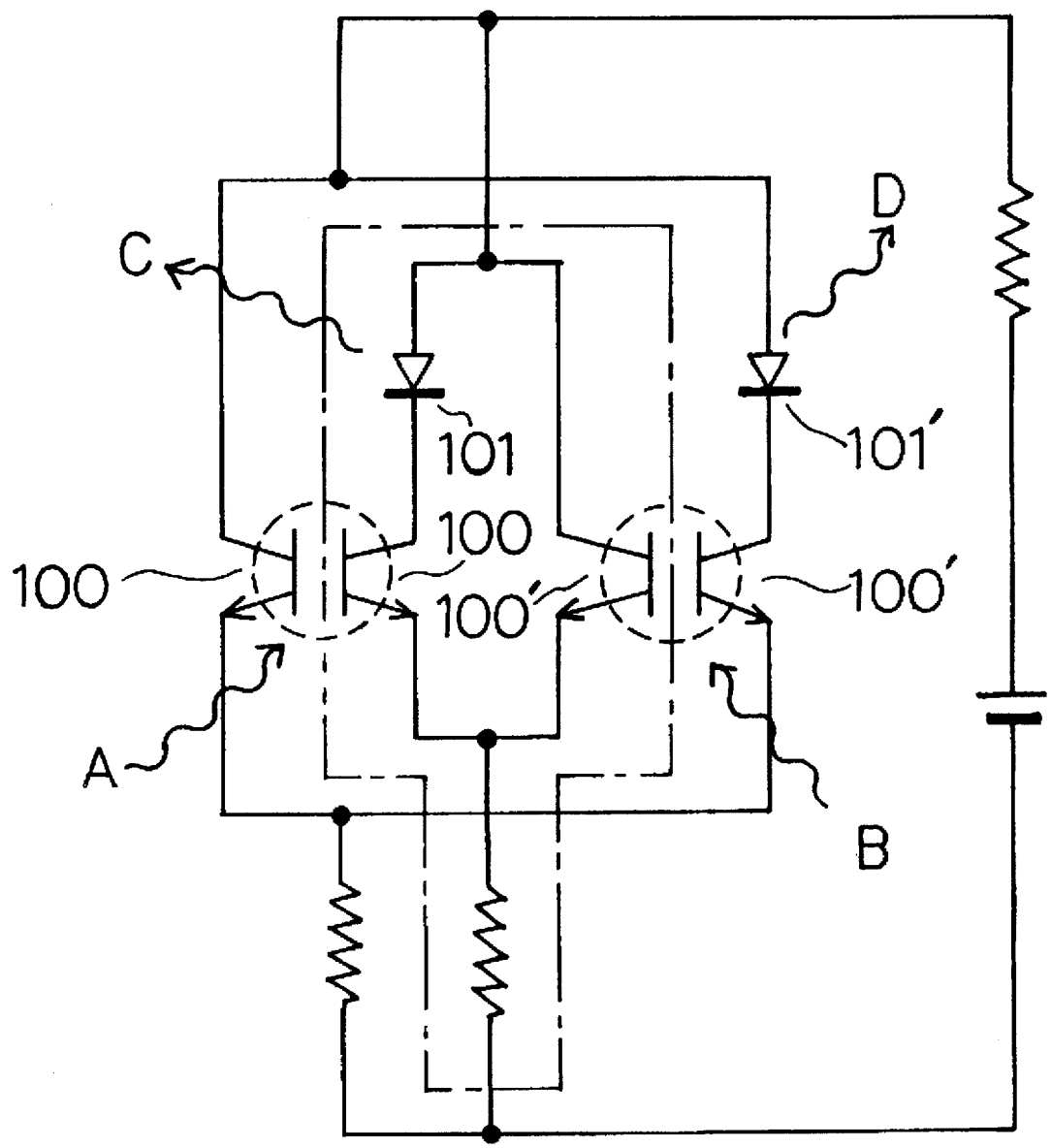
FIG. 16 is an equivalent circuit diagram of a conventional optical functional semiconductor element.
Figure 17:
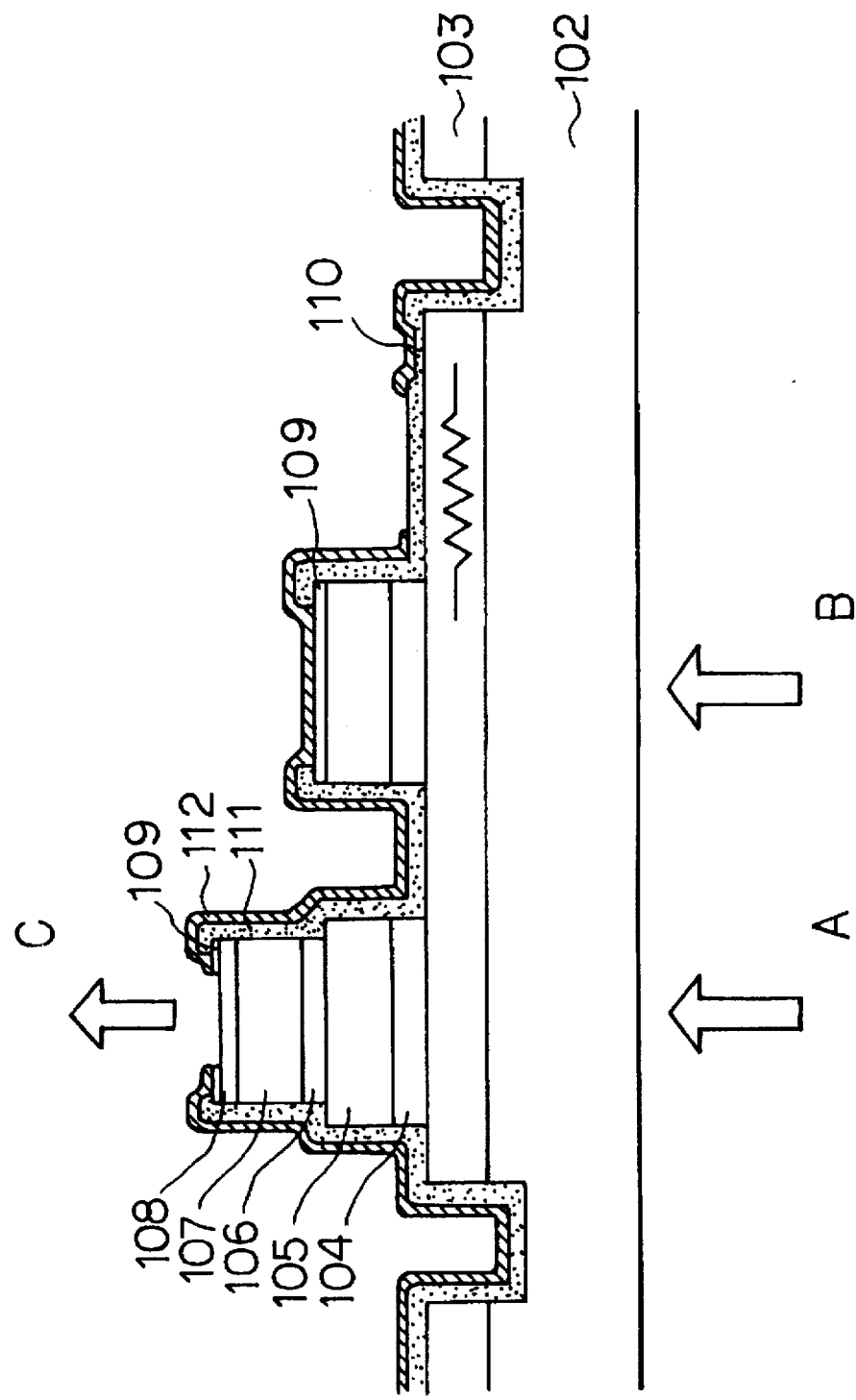
FIG. 17 is a cross-sectional view showing an example of a conventional optical functional semiconductor element corresponding to the example of FIG. 16.
Figure 18:
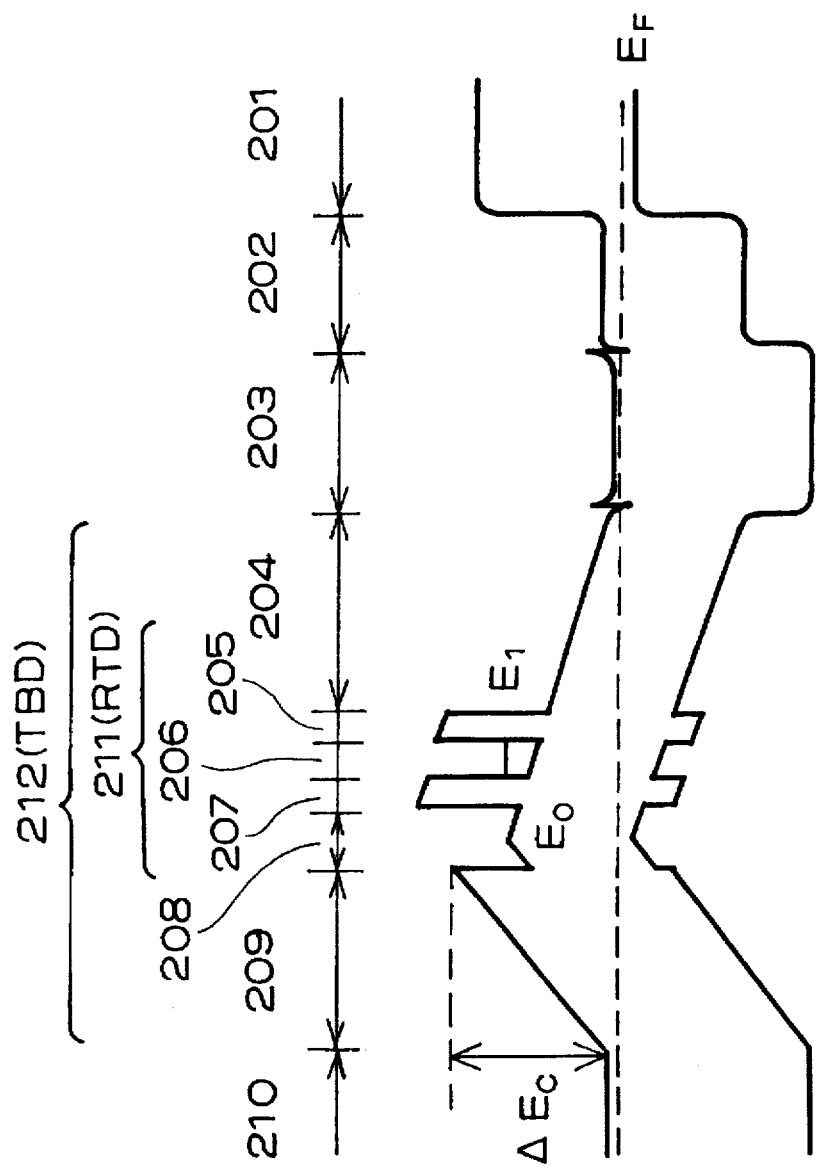
FIG. 18 is a band diagram of an optical functional semiconductor element illustrating an embodiment thereof by Applicants in developing the present invention.

Each element is basically the DFB laser type having the ¼ shift diffraction grating formed along the active layer as depicted in FIG. 10; in this embodiment, however, the output waveguide 20 as well as the active layer 2 have the buried structure and the outputs from the respective elements are multiplexed by the optical multiplexer 21 and the composite output is emitted as the output light $P_O$ from the end face 22. Next, the operation of this embodiment will be described. Each element is supplied with two kinds of bit patterns a and A from the two-input fiber 23 with a fiber coupler. Since the bit strings are usually input in time sequence, the respective bits of the patterns occurring at the same time instant are spatially isolated by means of serial-parallel converters such as fiber delay lines shown in FIG. 15, and the converted outputs are provided to input ports $P_{1a}$, $P_{2a}$, $P_{3a}$, $P_{4a}$ and $P_{5a}$, respectively. Each bit pattern thus processed is coupled by the fiber coupler with one of the other bit patterns A which are provided to input ports $P_{1A}$, $P_{2A}$, $P_{3A}$, $P_{4A}$ and $P_{5A}$ in parallel, and the thus combined output is applied to the corresponding element. In each element, the thus combined incident light is absorbed in the light absorbing layer 4 to bias the p-InGaAs or p-InGaAsP layer 5. At this time, the number of electrons which are allowed to pass through the RTD 14 for injection into the active layer 2 varies with the incident light pattern as referred to previously. Only when one of the two bits is a "1" and the other a "0" the active layer 2 has a large gain and oscillates by the λ/4 shift diffraction grating 18 and the output light is emitted from the en face 22. When the two bits are both "0's" or "1's" no electrons are injected into the active layer 2; hence, no output light is emitted from the end face 22. That is, in this element, only when all the pair of bit patterns a and A match with one another at each bit position, the output $P_O$ from the end face 22 is zero, and when a mismatch occurs even at one bit position, the output $P_O \neq 0$ is generated; thus, the match or mismatch between bit patterns can be judged from the presence or absence of the output from the end face 22.

Furthermore, the output wavelength of each DFB laser is dependent on the period of the λ/4 shift diffraction grating 18; hence, by using a different period for the diffraction grating of each element and monitoring the output wavelength of the respective laser, it is possible to pinpoint the bit position where a mismatch occurred.

As described above, the present invention permits the implementation of an optical functional semiconductor element whose output light is modulated in accordance with the incident light intensity, an optical bistable element which can be set and reset optically, a bit pattern matching element for lightwave bit trains by using a plurality of elements, and a multi-stable state by the introduction of a plurality of quantum levels. While the above embodiments have been described on the assumption that the first conductivity type is and the second conductivity type p, the same results as described above could be obtained even by reversing the conductivity types. In such a case, the majority carriers that flow in the TBD are usually holes of large mass, but the introduction of strain permits reduction of the mass, enabling the high-speed operation. In the above-described embodiment, the resonant-tunneling diode is formed by a single quantum well, but the same optical functional operation as referred to previously could also be obtained with a multiple quantum well type resonant-tunneling diode using a plurality of quantum wells. Moreover, although the present invention has been described to use the InGaAlAs- and InGaAsP-series semiconductor materials, the invention is not limited specifically thereto but may use AlGaAs- and non-lattice match semiconductor materials. If necessary, an ething-stop layer may also be used, in which case the same optical functional operation as mentioned above can likewise be achieved. Besides, the TBD and the RTD used in the embodiments are single, but by using pluralities of them each provided in a laminated form, higher performance optical elements can be obtained.

As described above in detail, the present invention offers a high-speed optical functional element which has the resonant-tunneling diode (RTD) provided apart from the light absorbing layer formed by one of i-type layers of the triangular barrier diode (TBD) and in which the biasing of the RTD is controlled by irradiation with light, whereby it is possible to obtain, with high contrast, a characteristic that output light is emitted from the active layer only when the incident light to the light absorbing layer has a predetermined intensity, whereas when the incident light does not have the predetermined intensity, no output light is generated. By using a two-input structure, an optical XOR functional element can be obtained; by incorporating optical feedback scheme, an optical bistable element can be obtained which is capable of optical set and reset; and by using a plurality of such elements, it is possible to implement an ultrafast bit pattern matching element for light-wave bit trains, a multi-stable element and various other optical functional elements. Thus, the optical functional semiconductor element of the present invention permits the construction of a wide-band communication network employing self-routing circuits for lightwave signals; hence, the present invention is of great utility when employed in practice.

What we claim is:

1. An optical functional semiconductor element comprising: a semiconductor multilayered structure, a resonant-tunneling diode and electrodes for applying a voltage across the element;

said semiconductor multilayered structure comprising a first semiconductor layer of a first conductivity type, a first i-type semiconductor layer, a first semiconductor layer of a second conductivity type, a second i-type semiconductor light absorbing layer and a second semiconductor layer of the first conductivity type stacked in sequential order;

said resonant-tunneling diode being positioned in a region other than the second i-type semiconductor light absorbing layer and comprising a first tunneling barrier layer, a quantum well layer and a second tunneling barrier layer;

one of said electrodes being positioned on a top surface of said semiconductor multilayered structure or said resonant-tunneling diode to cover only a part of said top surface so that control light incident to the optical functional semiconductor element can be applied through a remainder of said top surface not covered with said one of said electrodes.

2. An optical functional semiconductor element according to claim 1, in which said resonant-tunneling diode is disposed in a region other than a triangular barrier diode comprising said first i-type layer said first semiconductor layer of the second conductivity type and said i-type semiconductor light absorbing layer.

3. An optical functional semiconductor element according to claim 1 or 2, in which said semiconductor multilayered structure further includes a light emitting layer or a light modulating layer.

4. An optical functional semiconductor element according to claim 3, in which said second i-type semiconductor light absorbing layer is disposed between the first semiconductor layer of the second conductivity type and the light emitting layer or the light modulating layer.

* * * * *